(12) United States Patent
Yang et al.

(10) Patent No.: US 8,853,740 B2
(45) Date of Patent: Oct. 7, 2014

(54) STRAINED SILICON CHANNEL SEMICONDUCTOR STRUCTURE

(71) Applicant: United Microelectronics Corp., Hsin-Chu (TW)

(72) Inventors: Chan-Lon Yang, Taipei (TW); Ted Ming-Lang Guo, Tainan (TW); Chin-I Liao, Tainan (TW); Chin-Cheng Chien, Tainan (TW); Shu-Yen Chan, Changhua County (TW); Chun-Yuan Wu, Yun-Lin County (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 13/905,148

(22) Filed: May 30, 2013

(65) Prior Publication Data

US 2013/0256701 A1    Oct. 3, 2013

Related U.S. Application Data

(62) Division of application No. 13/274,357, filed on Oct. 17, 2011, now Pat. No. 8,476,169.

(51) Int. Cl.
| | | |
|---|---|---|
| H01L 29/78 | (2006.01) | |
| H01L 29/66 | (2006.01) | |
| H01L 21/324 | (2006.01) | |
| H01L 21/8234 | (2006.01) | |
| H01L 21/306 | (2006.01) | |

(52) U.S. Cl.
CPC ..... *H01L 29/7848* (2013.01); *H01L 21/823425* (2013.01); *H01L 21/30608* (2013.01); *H01L 29/6656* (2013.01); *H01L 29/66636* (2013.01); *H01L 21/3247* (2013.01)
USPC .......................................................... 257/190

(58) Field of Classification Search
CPC ............ H01L 29/7848; H01L 29/6656; H01L 29/66636
USPC .............................. 257/77, 190, 288, E29.193
See application file for complete search history.

(56) References Cited

U.S. PATENT DOCUMENTS

| | | | |
|---|---|---|---|
| 4,891,303 A | 1/1990 | Garza | |
| 5,217,910 A | 6/1993 | Shimizu | |
| 5,273,930 A | 12/1993 | Steele | |
| 5,356,830 A | 10/1994 | Yoshikawa | |
| 5,372,957 A | 12/1994 | Liang | |
| 5,385,630 A | 1/1995 | Philipossian | |
| 5,399,506 A | 3/1995 | Tsukamoto | |
| 5,625,217 A | 4/1997 | Chau | |
| 5,777,364 A | 7/1998 | Crabbe | |
| 5,783,478 A | 7/1998 | Chau | |
| 5,783,479 A | 7/1998 | Lin | |
| 5,960,322 A | 9/1999 | Xiang | |
| 6,030,874 A | 2/2000 | Grider | |
| 6,048,756 A | 4/2000 | Lee | |
| 6,074,954 A | 6/2000 | Lill | |
| 6,100,171 A | 8/2000 | Ishida | |

(Continued)

*Primary Examiner* — Nikolay Yushin
(74) *Attorney, Agent, or Firm* — Winston Hsu; Scott Margo

(57) ABSTRACT

A strained silicon channel semiconductor structure comprises a substrate having an upper surface, a gate structure formed on the upper surface, at least one recess formed in the substrate at lateral sides of the gate structure, wherein the recess has at least one sidewall which has an upper sidewall and a lower sidewall concaved in the direction to the gate structure, and the included angle between the upper sidewall and horizontal plane ranges between 54.5°-90°, and an epitaxial layer filled into the two recesses.

7 Claims, 5 Drawing Sheets

(56) References Cited

U.S. PATENT DOCUMENTS

| | | |
|---|---|---|
| 6,110,787 A | 8/2000 | Chan |
| 6,165,826 A | 12/2000 | Chau |
| 6,165,881 A | 12/2000 | Tao |
| 6,191,052 B1 | 2/2001 | Wang |
| 6,228,730 B1 | 5/2001 | Chen |
| 6,274,447 B1 | 8/2001 | Takasou |
| 6,355,533 B2 | 3/2002 | Lee |
| 6,365,476 B1 | 4/2002 | Talwar |
| 6,368,926 B1 | 4/2002 | Wu |
| 6,444,591 B1 | 9/2002 | Schuegraf |
| 6,537,370 B1 | 3/2003 | Hernandez |
| 6,544,822 B2 | 4/2003 | Kim |
| 6,605,498 B1 | 8/2003 | Murthy |
| 6,613,695 B2 | 9/2003 | Pomarede |
| 6,621,131 B2 | 9/2003 | Murthy |
| 6,624,068 B2 | 9/2003 | Thakar |
| 6,632,718 B1 | 10/2003 | Grider |
| 6,642,122 B1 | 11/2003 | Yu |
| 6,664,156 B1 | 12/2003 | Ang |
| 6,676,764 B2 | 1/2004 | Joo |
| 6,699,763 B2 | 3/2004 | Grider |
| 6,703,271 B2 | 3/2004 | Yeo |
| 6,777,275 B1 | 8/2004 | Kluth |
| 6,806,151 B2 | 10/2004 | Wasshuber |
| 6,809,402 B1 | 10/2004 | Hopper |
| 6,858,506 B2 | 2/2005 | Chang |
| 6,861,318 B2 | 3/2005 | Murthy |
| 6,864,135 B2 | 3/2005 | Grudowski |
| 6,869,867 B2 | 3/2005 | Miyashita |
| 6,887,751 B2 | 5/2005 | Chidambarrao |
| 6,887,762 B1 | 5/2005 | Murthy |
| 6,891,192 B2 | 5/2005 | Chen |
| 6,930,007 B2 | 8/2005 | Bu |
| 6,946,350 B2 | 9/2005 | Lindert |
| 6,962,856 B2 | 11/2005 | Park |
| 6,972,461 B1 | 12/2005 | Chen |
| 6,991,979 B2 | 1/2006 | Ajmera |
| 6,991,991 B2 | 1/2006 | Cheng |
| 7,037,773 B2 | 5/2006 | Wang |
| 7,060,576 B2 | 6/2006 | Lindert |
| 7,060,579 B2 | 6/2006 | Chidambaram |
| 7,112,495 B2 | 9/2006 | Ko |
| 7,118,952 B2 | 10/2006 | Chen |
| 7,132,338 B2 | 11/2006 | Samoilov |
| 7,169,675 B2 | 1/2007 | Tan |
| 7,183,596 B2 | 2/2007 | Wu |
| 7,202,124 B2 | 4/2007 | Fitzgerald |
| 7,217,627 B2 | 5/2007 | Kim |
| 7,288,822 B1 | 10/2007 | Ting |
| 7,303,999 B1 | 12/2007 | Sriraman |
| 7,335,959 B2 | 2/2008 | Curello |
| 7,410,859 B1 | 8/2008 | Peidous |
| 7,462,239 B2 | 12/2008 | Brabant |
| 7,491,615 B2 | 2/2009 | Wu |
| 7,494,856 B2 | 2/2009 | Zhang |
| 7,494,858 B2 | 2/2009 | Bohr |
| 7,592,231 B2 | 9/2009 | Cheng |
| 7,667,227 B2 | 2/2010 | Shimamune |
| 7,691,752 B2 | 4/2010 | Ranade |
| 7,838,370 B2 | 11/2010 | Mehta |
| 2002/0160587 A1 | 10/2002 | Jagannathan |
| 2002/0182423 A1 | 12/2002 | Chu |
| 2003/0181005 A1 | 9/2003 | Hachimine |
| 2003/0203599 A1 | 10/2003 | Kanzawa |
| 2004/0045499 A1 | 3/2004 | Langdo |
| 2004/0067631 A1 | 4/2004 | Bu |
| 2004/0227164 A1 | 11/2004 | Lee |
| 2005/0070076 A1 | 3/2005 | Dion |
| 2005/0079692 A1 | 4/2005 | Samoilov |
| 2005/0082616 A1 | 4/2005 | Chen |
| 2005/0139231 A1 | 6/2005 | Abadie |
| 2005/0148147 A1 | 7/2005 | Keating |
| 2005/0260830 A1 | 11/2005 | Kwon |
| 2005/0285193 A1 | 12/2005 | Lee |
| 2005/0287752 A1 | 12/2005 | Nouri |
| 2006/0051922 A1 | 3/2006 | Huang |
| 2006/0057859 A1 | 3/2006 | Chen |
| 2006/0076627 A1 | 4/2006 | Chen |
| 2006/0088968 A1 | 4/2006 | Shin |
| 2006/0115949 A1 | 6/2006 | Zhang |
| 2006/0163558 A1 | 7/2006 | Lee |
| 2006/0228842 A1 | 10/2006 | Zhang |
| 2006/0231826 A1 | 10/2006 | Kohyama |
| 2006/0258126 A1 | 11/2006 | Shiono |
| 2006/0281288 A1 | 12/2006 | Kawamura |
| 2006/0292779 A1 | 12/2006 | Chen |
| 2006/0292783 A1 | 12/2006 | Lee |
| 2007/0023847 A1 | 2/2007 | Rhee |
| 2007/0034906 A1 | 2/2007 | Wang |
| 2007/0049014 A1 | 3/2007 | Chen |
| 2007/0072353 A1 | 3/2007 | Wu |
| 2007/0072376 A1 | 3/2007 | Chen |
| 2007/0082451 A1 | 4/2007 | Samoilov |
| 2007/0128783 A1 | 6/2007 | Ting |
| 2007/0166929 A1 | 7/2007 | Matsumoto |
| 2007/0262396 A1 | 11/2007 | Zhu |
| 2008/0014688 A1 | 1/2008 | Thean |
| 2008/0061366 A1 | 3/2008 | Liu |
| 2008/0067545 A1 | 3/2008 | Rhee |
| 2008/0076236 A1 | 3/2008 | Chiang |
| 2008/0085577 A1 | 4/2008 | Shih |
| 2008/0116525 A1 | 5/2008 | Liu |
| 2008/0124874 A1 | 5/2008 | Park |
| 2008/0128746 A1 | 6/2008 | Wang |
| 2008/0142839 A1 | 6/2008 | Fukutome |
| 2008/0142886 A1 | 6/2008 | Liao |
| 2008/0220579 A1 | 9/2008 | Pal |
| 2008/0233722 A1 | 9/2008 | Liao |
| 2008/0233746 A1 | 9/2008 | Huang |
| 2008/0237742 A1 | 10/2008 | Ranade |
| 2009/0039389 A1 | 2/2009 | Tseng |
| 2009/0045456 A1 | 2/2009 | Chen |
| 2009/0095992 A1 | 4/2009 | Sanuki |
| 2009/0117715 A1 | 5/2009 | Fukuda |
| 2009/0124056 A1 | 5/2009 | Chen |
| 2009/0166625 A1 | 7/2009 | Ting |
| 2009/0184402 A1 | 7/2009 | Chen |
| 2009/0186475 A1 | 7/2009 | Ting |
| 2009/0246922 A1 | 10/2009 | Wu |
| 2009/0278170 A1 | 11/2009 | Yang |
| 2009/0302348 A1 | 12/2009 | Adam |
| 2010/0001317 A1 | 1/2010 | Chen |
| 2010/0078689 A1 | 4/2010 | Kronholz |
| 2010/0093147 A1 | 4/2010 | Liao |

STRAINED SILICON CHANNEL SEMICONDUCTOR STRUCTURE

CROSS REFERENCE TO RELATED APPLICATIONS

This application is a division of U.S. patent application Ser. No. 13/274,357, filed Oct. 17, 2011, which is hereby incorporated by reference for all purposes.

BACKGROUND OF THE INVENTION

1. Field of the Invention

The present invention relates generally to a strained silicon channel semiconductor structure. In particular, the present invention relates to a strained silicon channel semiconductor structure with better carrier mobility.

2. Description of the Prior Art

With the trend of miniaturization of semiconductor device dimensions, the scale of the gate, source and drain of a transistor is decreased in accordance with the decrease in critical dimension (CD). Due to the physical limitations of the materials used, the decrease in scale of the gate, source and drain results in the decrease of carriers that determine the magnitude of the current in the transistor element, and this can therefore adversely affect the performance of the transistor. Increasing carrier mobility in order to boost up a metal oxide semiconductor (MOS) transistor is therefore an important topic in the field of current semiconductor techniques.

To boost the carrier mobility, one conventional attempt has been made by forming a strained silicon channel. The strained silicon channel can increase the mobility of an electron ($e^-$) group and a hole ($h^+$) group in the silicon channel without modifying the critical dimension of gate electrode, thereby improving the operation speed of the resulting transistor. This attempt is widely-used in the industry because it may attain better performance for semiconductor devices without complicating the original circuit design or manufacturing process.

In current implementations, one method for forming a strained silicon channel is using selective epitaxial growth (SEG) to grow an epitaxial layer as a stress source in the substrate. The epitaxial layer has the same lattice arrangement but different lattice constant than the silicon substrate. Thus the epitaxial layer may exert a stress on the lattice of the abutted silicon channel region to form a strained silicon channel, thereby attaining the efficacy of increasing carrier mobility.

For example, for the PMOS transistor using holes ($h^+$) as carrier in the channel, a SiGe (silicon-germanium) epitaxial layer may be formed in the source/drain region on the silicon substrate. Due to the lattice constant of SiGe epitaxy being inherently larger than that of Si, the SiGe epitaxial layer will exert a stress on the lattice of abutted silicon channel, thereby forming a compressive strained channel. The band-gap structure of compressive strained channel is advantageous to the transition of holes ($h^+$), thereby increasing the speed of PMOS device.

Similarly, for the NMOS transistor using electrons ($e^+$) as carrier in the channel, a SiC (silicon-carbon) epitaxial layer may be formed in the source/drain region on the silicon substrate. Due to the lattice constant of SiC epitaxy being inherently smaller than that of Si, the SiC epitaxial layer will exert a stress on the lattice of abutted silicon channel, thereby forming a tensile strained channel. The band-gap structure of tensile strained channel is advantageous to the transition of electrons ($e^+$), thereby increasing the speed of NMOS device.

Please refer now to FIG. 1. FIG. 1 is a schematic cross-section view of CMOS transistor structure using the technique of a strained silicon channel in the prior art. As shown in the figure, a conventional CMOS transistor structure 100 includes a PMOS region 102 and a NMOS region 104 spaced-apart by a shallow trench isolation (STI) 105. In addition to the conventional structures such as a gate 105, a source/drain (not shown) and a spacer 108, the PMOS region 102 and NMOS region 104 are also provided with recesses 110 formed on source/drain region in order to provide the space for the filling of stress material (ex. SiGe or SiC) to grow an epitaxial layer 112. The epitaxial layer 112 formed in the recess will exert a stress on a silicon channel region 114 between the source and drain, thereby forming a strained silicon channel and attaining the efficacy of increasing carrier mobility.

The semiconductor industry is still devoted to researching how to improve the carrier mobility and relevant electrical performance in semiconductor devices in order to respond to the even smaller scale of semiconductor devices in the future. Regarding the semiconductor technique based on strained silicon channel, it is still urgent for those skilled in the art to improve the structure thereof for further improving the relevant electrical performance.

SUMMARY OF THE INVENTION

To further improve the performance of strained silicon semiconductor structures, the present invention provides an improved strained silicon semiconductor structure. The strained silicon semiconductor structure of present invention has better carrier mobility because the epitaxial layer (as stress source) is closer to the silicon channel region.

One object of the present invention is to provide a strained silicon channel semiconductor structure comprising a substrate having an upper surface, a gate structure formed on said upper surface, at least one recess formed in said substrate at lateral sides of said gate structure, wherein said recess has at least one sidewall, said sidewall has an upper sidewall and a lower sidewall concaved in the direction to said gate structure, and the included angle between said upper sidewall and horizontal plane ranges between 54.5°-90°, and an epitaxial layer filled into said two recesses.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute apart of this specification. The drawings illustrate some of the embodiments and, together with the description, serve to explain their principles. In the drawings.

Figure 1:
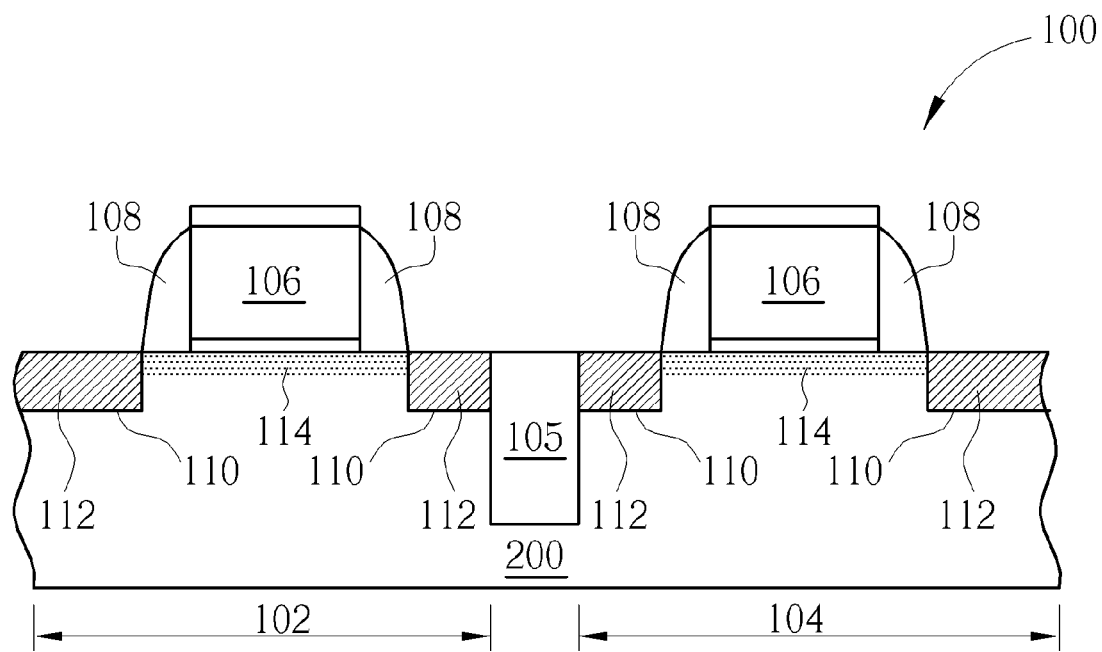
FIG. 1 is a schematic cross-section view of CMOS transistor structure using the technique of a strained silicon channel in the prior art.

It should be noted that all the figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

FIGS. 2-8 are schematic views illustrating the process flow of making a strained silicon channel semiconductor structure in accordance with the preferred embodiment of the present invention. Those figures will be referred in order to describe the steps of making a strained semiconductor structure of the present invention. For the simplicity of description, a horizontal direction H parallel to the surface of substrate 10 and a vertical direction V perpendicular to the surface of substrate 10 are defined in the drawings.

Figure 2:
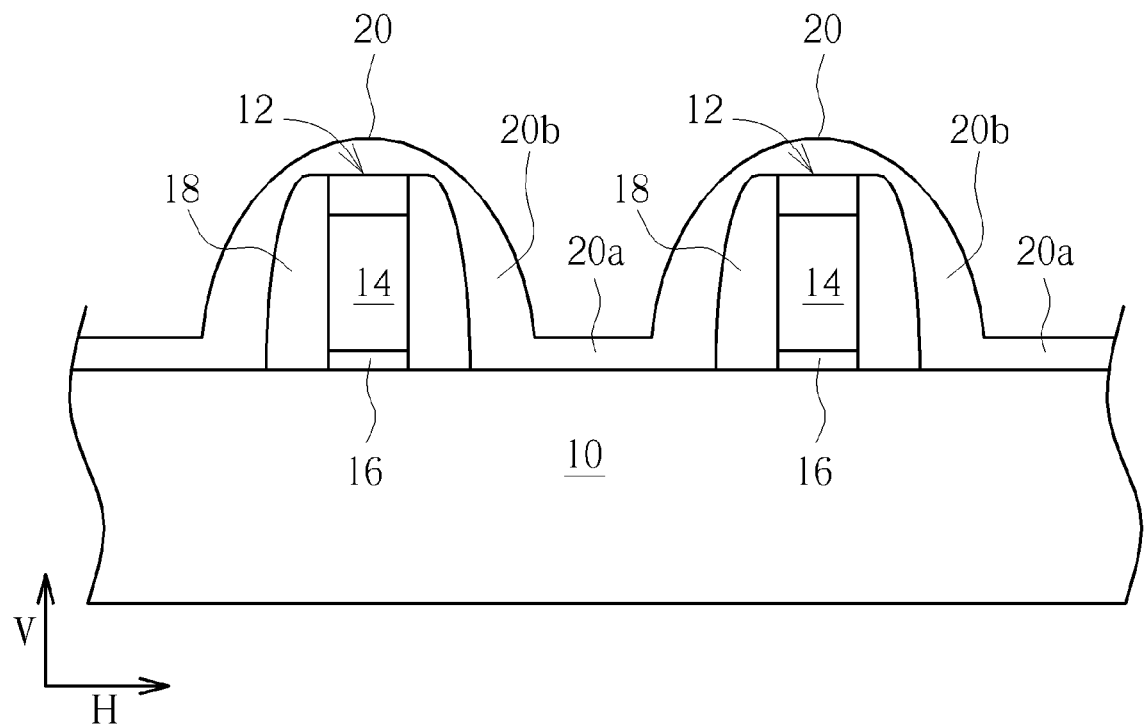
FIGS. 2-8 are schematic views illustrating the process flow of making a strained silicon channel semiconductor structure in accordance with the preferred embodiment of the present invention.

Please refer firstly to FIG. 2, a substrate 10 is provided in the method. Said substrate may be a semiconductor substrate comprising but not limited to a silicon wafer or a SOI (silicon-on-isolator) substrate. A plurality of gate structures 12 is formed on said substrate 10. Each gate structure 12 comprises agate conductive layer 14, a gate dielectric layer 16 formed between the surface of substrate 10 and gate conductive layer 14, and a spacer 18 formed on sidewalls around the gate conductive layer 14. A liner is formed optionally between the spacer 18, gate conductive layer 14 and substrate 10. In present embodiment, the gate dielectric layer 16 may be made of SiO2 or high-k dielectric layer. The spacer 18 may be made of a silicon-oxide layer or a silicon-nitride layer in form of single layer or composite layer. The gate conductive layer 14 may be made of doped poly-Si, salicide or metal, etc. For simplicity, in the description of the present invention, the detailed structural and functional description for above-mentioned well-known components of gate structure 12 will not be made hereinafter.

In other embodiment of present invention, the gate structure 12 may also be integrated into the gate-first process or gate-last process, wherein the gate-last process may be a gate-last process for high-k dielectric post-layer or for high-k dielectric per-layer. The step for those conventional transistor processes will not be described herein.

As shown in FIG. 2, after the formation of the gate structure 12, a sacrificial material layer 20 is blanket-deposited conformingly on the substrate 10 and the gate structure 12. The portion 20a of the sacrificial material layer 20 deposited right on the surface of the substrate may be relatively thinner, while the portion 20b of the sacrificial material layer 20 deposited right on the surface of the substrate may be relatively thicker. In this way, the sacrificial material layer 20 may be modified to a desired pattern for serving as an etch mask in a later process, for which the details will be described in the embodiment hereafter.

Figure 3:
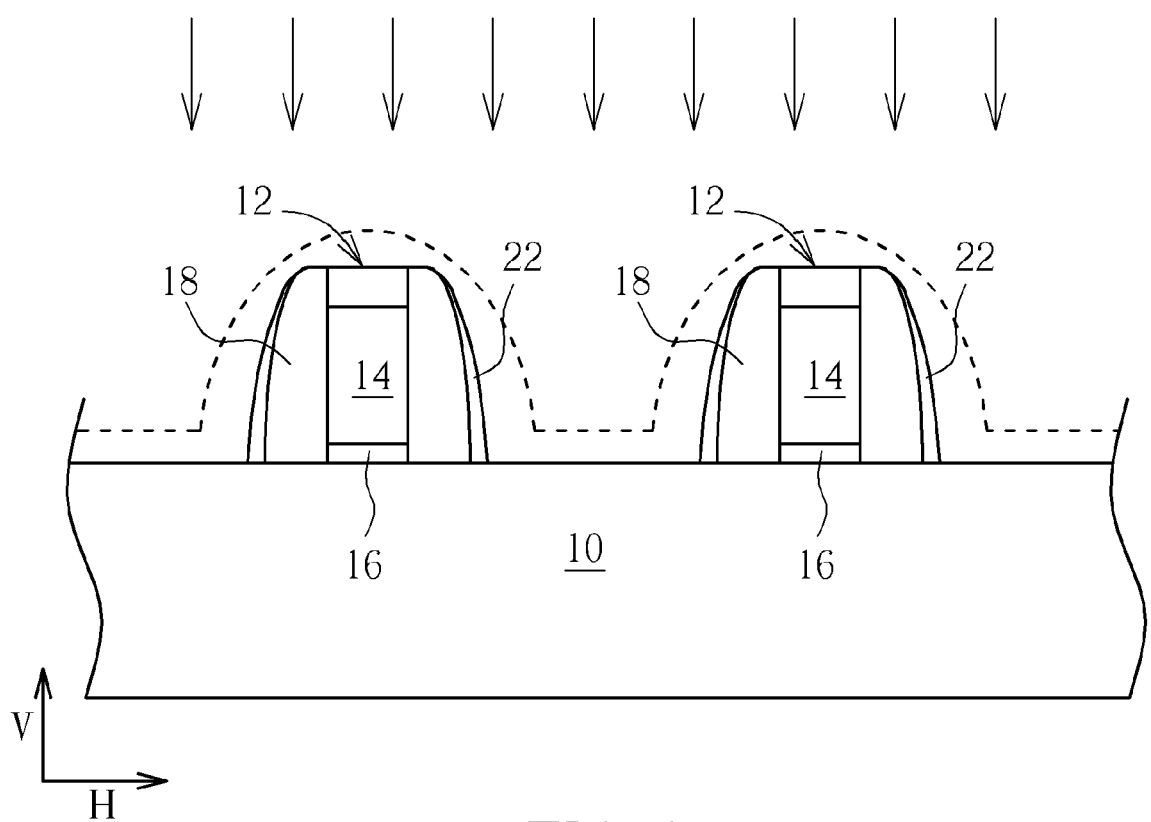

Please refer subsequently to FIG. 3. After the formation of the sacrificial material layer 20, a first dry etching process is performed on the entire substrate 10. This dry etching process may remove all the portion 20a of the sacrificial material layer covering right upon the substrate 10 and reserve a thin layer (referred to hereinafter as a sacrificial spacer 22) covering on the surface of the spacer 18 after the etching of the portion 20b of the sacrificial material layer 20. The reserved sacrificial spacer 22 is used as an etch mask in a later etching process.

Figure 4:
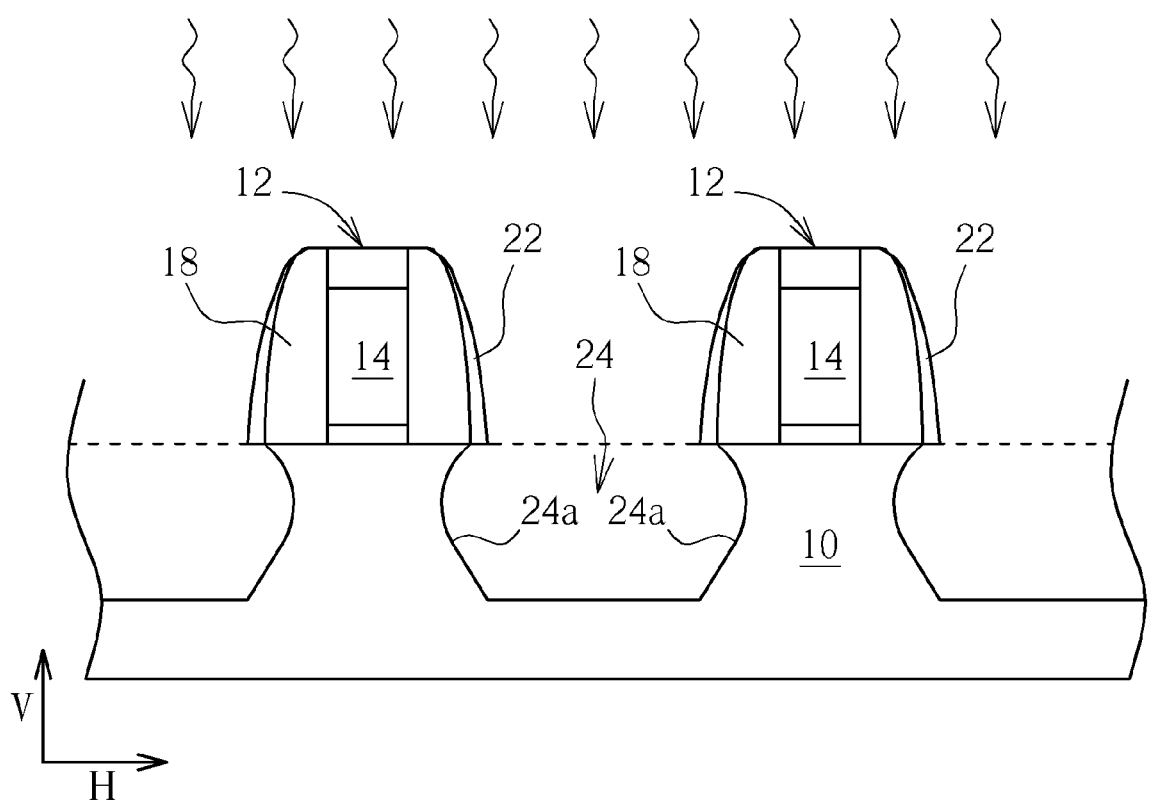

Please refer subsequently to FIG. 4. After the formation of the sacrificial spacer 22, a first etching process is performed on the entire substrate 10 with the sacrificial spacer 22 being used as an etch mask. Said first etching process includes a first dry etching process and a first wet etching process, wherein said first dry etching process provides downward etching, while said first wet etching process provides downward etching and lateral etching. Said first dry etching process uses $SF_6$-based etchant or $NF_3$-based etchant which are etch-selective to the material of the substrate 10, thus a recess 24 structure will be etched out in the substrate 10. Furthermore, during the first wet etching process, the etchant will etch the substrate 10 both in the horizontal direction H and the vertical direction V, wherein the etching rate in the horizontal direction H is larger than the etching rate in the vertical direction V, thereby forming a concave surface 24a concaved in the direction to the gate structure in the substrate 10.

Figure 5:
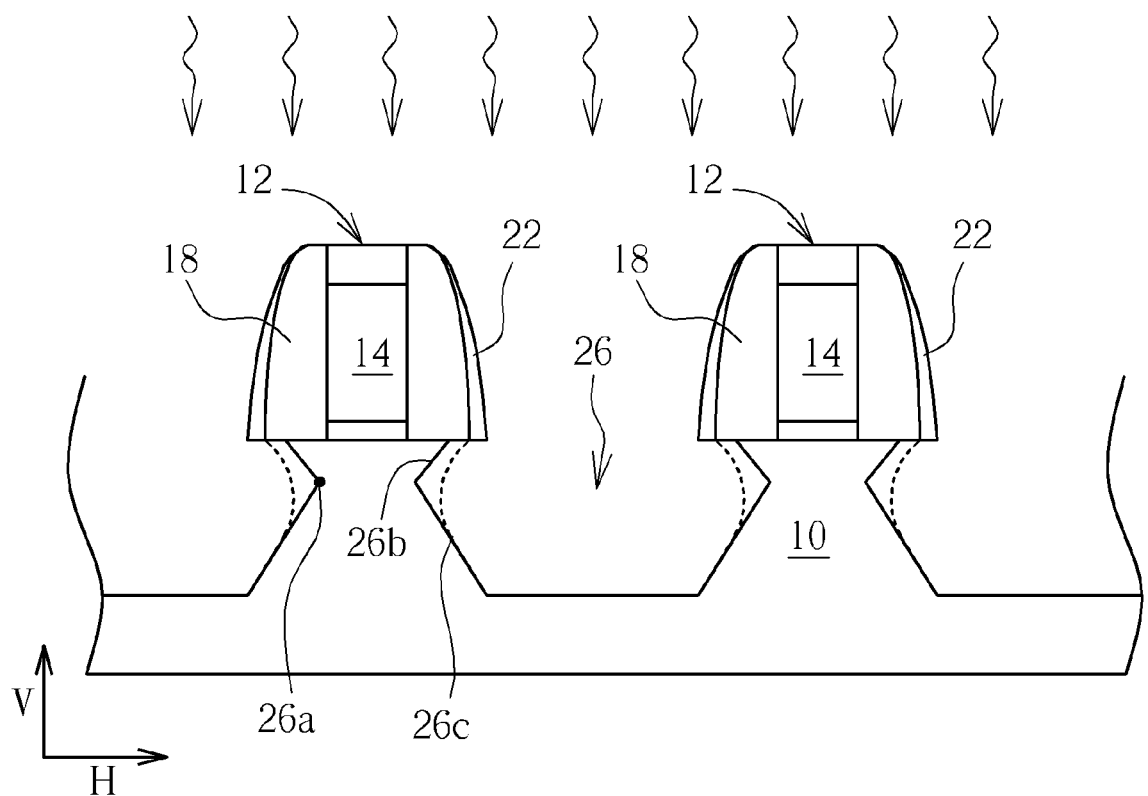

Please refer to FIG. 5. A second wet etching process is performed subsequently after the formation of the above-mentioned first dry etch recess 24. Said second wet etching process uses a $NH_4OH$-based etchant or a TMAH-based etchant which is etch-selective to material of the substrate 10 to further etch the sidewall of said first dry etch recess 24 formed in the previous step. Furthermore, because those etchants etch the silicon substrate 10 along the crystallographic plane (110) and (111), the first dry etch recess 24 will be transformed into a diamond-shape recess 26 having distinguishing etching planes (shown as the upper sidewall 26b and lower sidewall 26c shown in the figure). An acute angle (or tip) 26a is formed at the intersection of said upper sidewall 26b and lower sidewall 26c on the sidewall of said diamond-shape recess 26.

Figure 6:
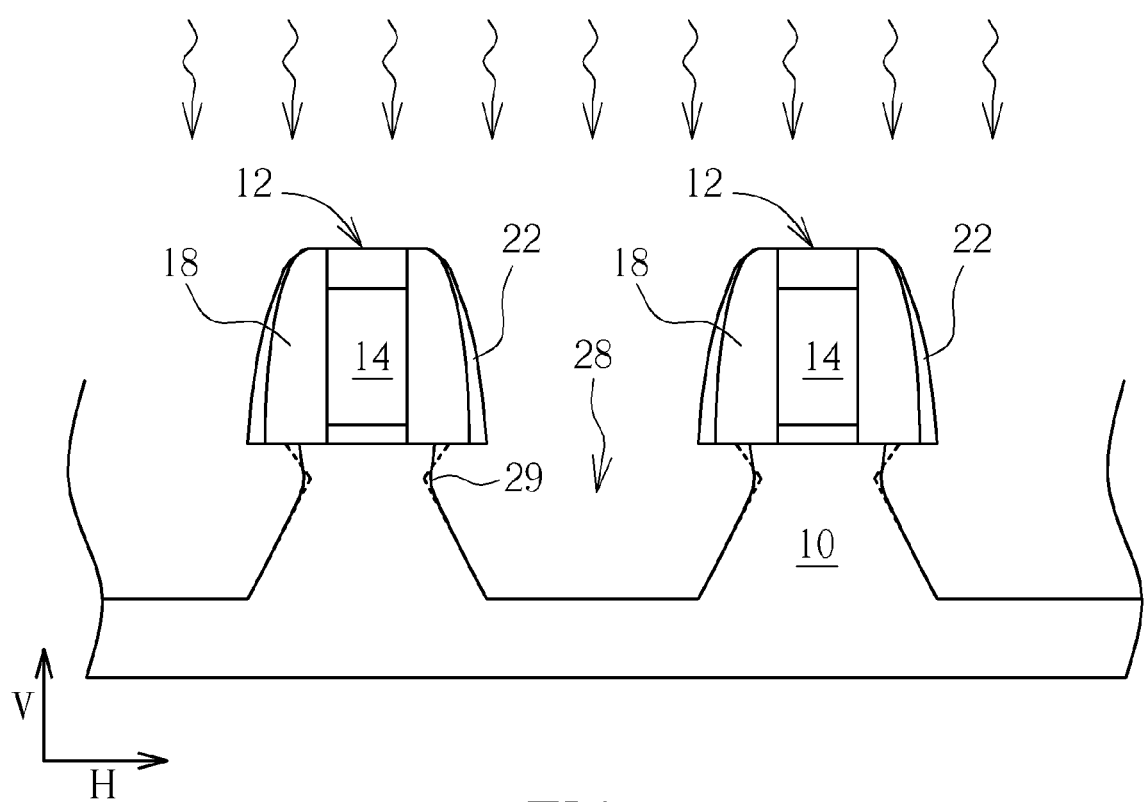

Please refer subsequently to FIG. 6. After the formation of above-mentioned recess 26, a pre-bake process is performed on the entire substrate 10. Said pre-bake process will diffuse and rearrange the atoms near the sidewall of the diamond-shape recess 26, thereby rounding the acute angle 26a (i.e. by increasing the angle) at the sidewall of the recess 26. In this way, the shape of the recess 26 is transformed from the original diamond shape into a diamond-like recess 28 with a more rounded sidewall surface 29. In a preferred embodiment of the present invention, the process parameter of pre-bake step is set to the temperature ranging between 700° C.-1000° C. and pressure under 10 torr to few hundred torr in hydrogen-containing ambiance with process time ranging from a few seconds to several minutes. The detailed structure of the above-mentioned diamond-like recess 28 will be further described in the embodiment hereafter.

Figure 7:
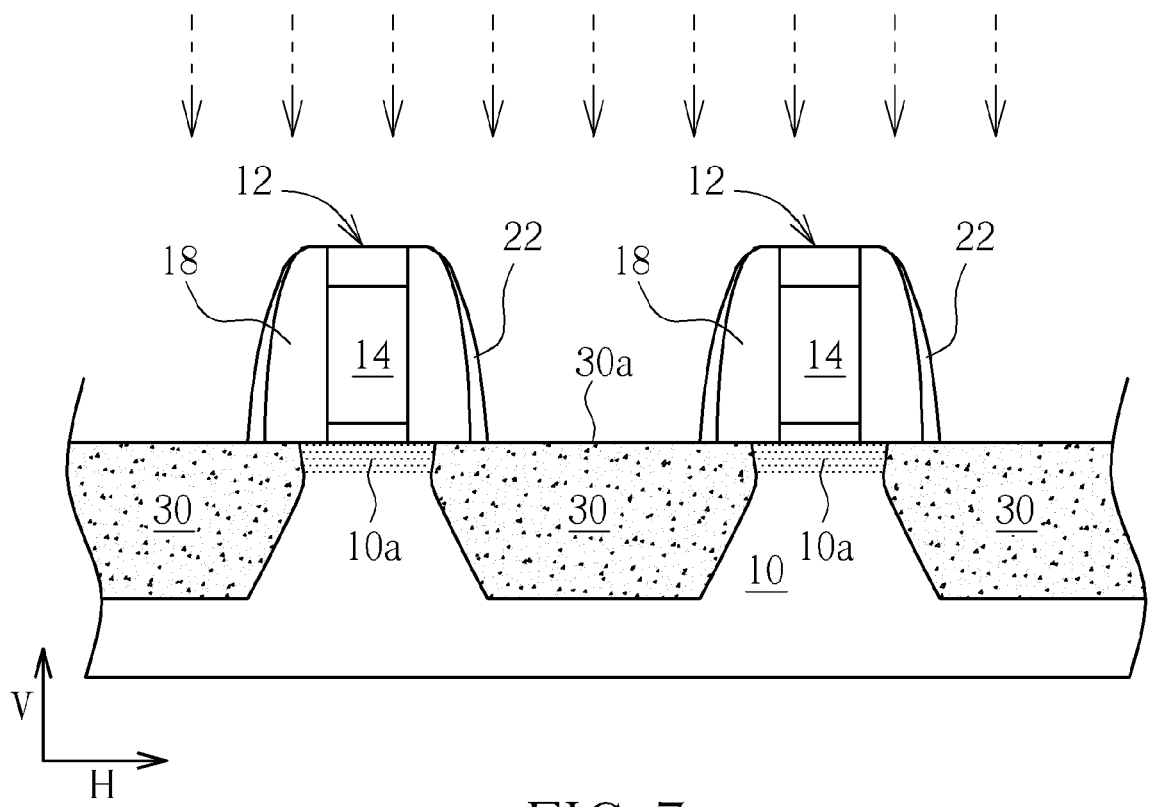

In the final step, please refer to FIG. 7, a selective epitaxial growth (SEG) process is performed for growing an epitaxial layer 30 in the diamond-like recess 28. The epitaxial layer 30 is used as a stress source to strain the abutted silicon channel. Preferably, the upper surface of the epitaxial layer 30 should be deposited higher than the surface of the substrate 10 in order to enhance the effect of epitaxial strain. In present embodiment, the epitaxial layer 30 may be made of SiGe (for PMOS transistor) or SiC (for NMOS transistor) which will exert a stress on abutting silicon channel region 10a, thereby attaining the efficacy of improving carrier mobility. Please note that the epitaxy process and previous pre-bake process may be performed in the same deposition chamber, in which the epitaxial layer is subsequently grown right after the deposition chamber is heated and the pre-bake process is finished.

Figure 8:
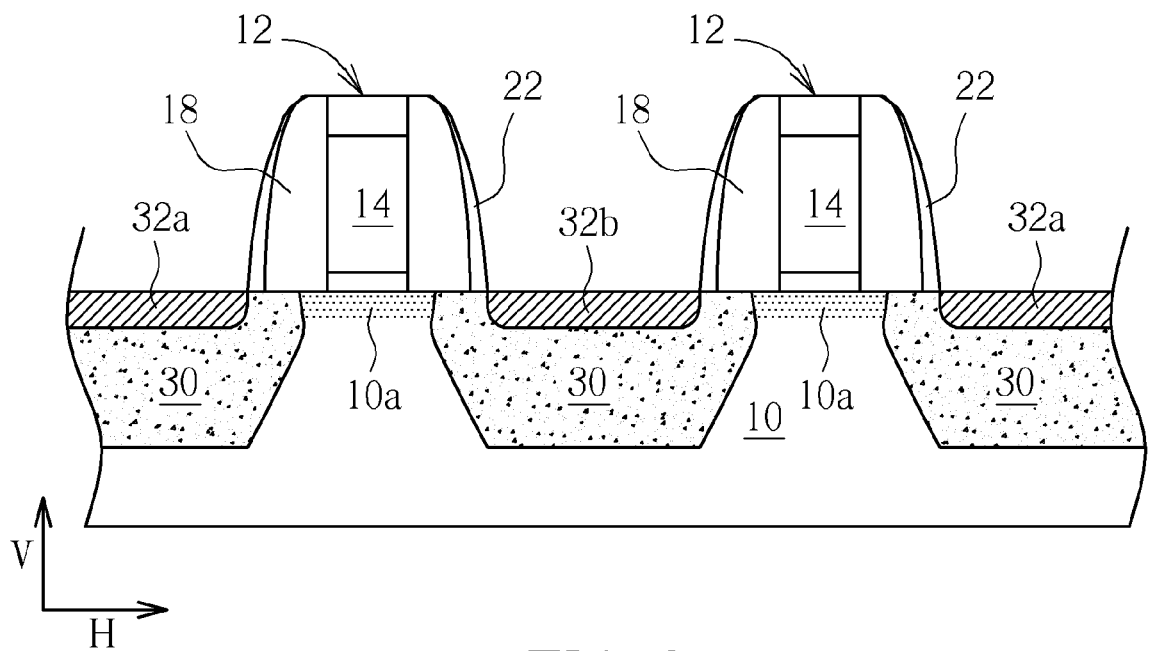

In a further embodiment of the present invention, as shown in FIG. 8, an ion implantation process is optionally performed on the epitaxial layer 30 formed in the previous step. Said ion implantation process uses photo resist (not shown) or the gate structure 12 as a mask to implant the N-type dopants (such as P, As or Sb) or P-type dopants (such as B, $BF_2$) respectively combining with other co-implant species, e.g., C, N2, F, Ge, Si into the corresponding epitaxial layer 30 in the NMOS or PMOS region, thereby defining the source/drain area 32a/32b in the epitaxial layer 30 at opposite sides of the gate structure 14. So far, a complete transistor structure is finished. Please note that in other embodiments of the present invention, the step of defining the source/drain may be performed before the etching of the recess or performed concurrently with the selective epitaxial process, depending on the process requirement. In still another embodiment of the present invention, an additional spacer (not shown) may be optionally formed on the gate structure 12 to define the size of source/drain area 32a/32b before the ion implantation process.

Besides, the sacrificial spacer 22 formed in the previous step may also be stripped by an additional etching process. In other embodiments, this sacrificial spacer may be reserved as a spacer structure.

Figure 9:
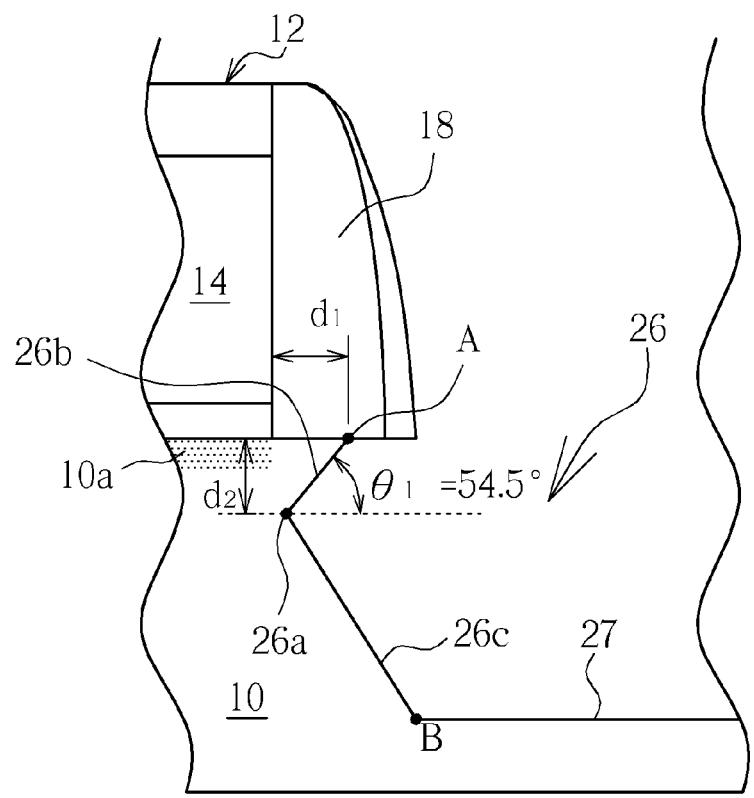
FIG. 9 is an enlarged, partial schematic view illustrating the profile of a recess in strained silicon channel semiconductor structure before a pre-bake process in accordance with the present invention.
Figure 10:
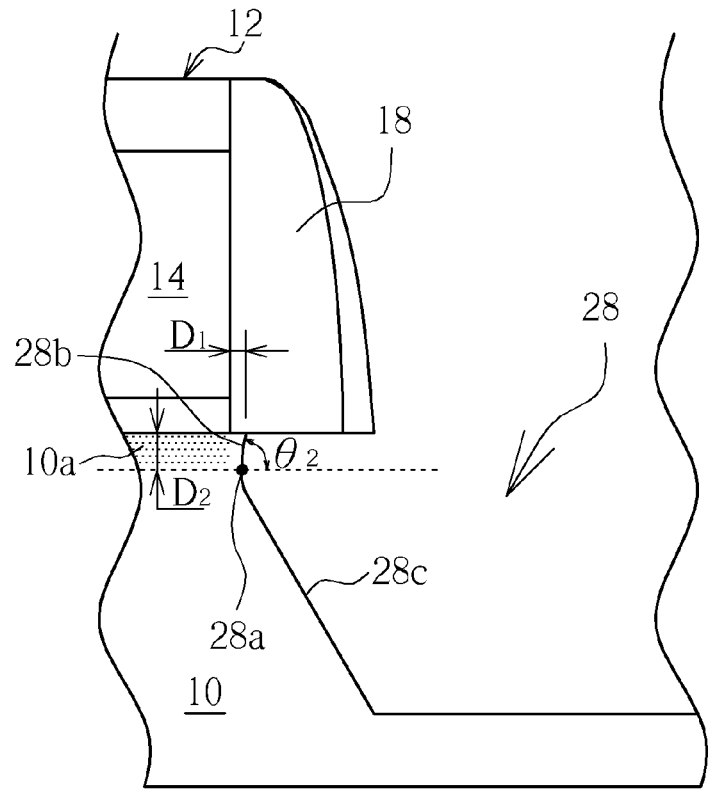
FIG. 10 is an enlarged, partial schematic view illustrating the profile of the recess in strained silicon channel semiconductor structure after the pre-bake process in accordance with the present invention.

Please now refer concurrently to FIG. 9 and FIG. 10. FIG. 9 and FIG. 10 are enlarged, partial cross-section views illustrating the recess of strained silicon channel semiconductor structure formed before and after a pre-bake process in accordance with the embodiment of the present invention. As shown in FIG. 9, because the etchant will etch the silicon substrate 10 along a specific crystallographic plane during the formation of the recess, the cross-section shape of the recess 26 will be a perfect diamond-shape. More specifically, the recess 26 is form of at least one sidewall and a bottom surface 27. Said sidewall further includes an upper sidewall 26b and a lower sidewall 26c. Due to the effect of lateral etching in present invention, the sidewall is formed under the spacer 18 of the gate structure 12, wherein the upper sidewall 26b intersects with the surface of substrate 10 right under the spacer 18 (as point A shown in the figure), while the intersection of the lower sidewall 26c and bottom surface 27 (as point B shown in the figure) may or may not located below the spacer 18. The upper sidewall 26b and lower sidewall 26c (i.e. distinguishing etching planes are concaved in the direction to the gate structure 12 and intersect with each other at an intersection (or tip) 26a. As shown in the figure, the upper sidewall 26b of the recess 26 is oriented at a fixed angle $\theta_1 = 54.5°$ with respect to the horizontal plane. In the present embodiment, the horizontal distance from the intersection (point A) of the upper sidewall 26b and the surface of the substrate to the gate conductive layer 14 is denoted as $d_1$, while the vertical distance from the tip 26a to the surface of the substrate 10 is denoted as $d_2$. The distances $d_1$ and $d_2$ have an influence on how efficiently the stress induced by the epitaxial layer may be exerted on the silicon channel. Taking the semiconductor device with 32 nm gate CD as an example, the distance $d_1$ and $d_2$ is 130 Å and 200 Å, respectively.

Please refer now to FIG. 10. The recess 26 in the present embodiment is transformed into a diamond-like recess 28 after a high temperature, low pressure pre-bake process. The recess 28 has a more rounded sidewall surface (that is, the angle between the upper sidewall 28b and the lower surface 28c is larger) concaved in the direction to the gate structure 14 and extended below the spacer, thereby the epitaxial layer formed thereafter may be closer to the silicon channel region 10a. In one implementation, after the sample undergoes an 800° C. pre-bake process, the angle $\theta_2$ between the upper sidewall 28b and the horizontal plane is changed from 54.5° to 75°, the horizontal distance $D_1$ from the intersection of upper sidewall 28b and the surface of substrate 10 to gate conductive layer 14 is shrunk from 130 Å to 70 Å, and the vertical distance D2 from tip 28a to the surface of substrate 10 is shrunk from 200 Å to 172 Å. The above-mentioned data shows the sidewall of the recess 28 after the pre-bake process is closer to the silicon channel region (i.e. reduced $D_1$ and $D_2$), thereby the epitaxial layer formed thereafter may exert more stress on the channel region and attain a better strain effect.

Please note that the shape of the final recess structure in present invention may vary with different process conditions during the pre-bake step. Generally, the pre-bake process is set at the temperature ranging between 700° C.-1000° C. and at the pressure under 10 torr to several hundreds torr in hydrogen-containing ambiance with process time ranging from a few seconds to several minutes. For the diamond-like recess structure formed thereafter, the resulting angle $\theta_2$ between the upper sidewall and the horizontal plane may range from 54.5° to 90°, preferably 75° to 90°. Also, for the scale of 35 nm gate CD circuit architecture, the distance is preferably smaller than 130 Å, while the resulting D2 distance is preferably smaller than 200 Å.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A strained silicon channel semiconductor structure, comprising:
    a substrate having an upper surface;
    a gate structure formed on said upper surface;
    at least one recess formed in said substrate at lateral sides of said gate structure, wherein said at least one recess has at least one sidewall and a bottom surface, said at least one sidewall has an upper sidewall and a lower sidewall concaved in the direction to said gate structure, and an included angle between said upper sidewall and a horizontal plane ranges between 75°-90°; and
    an epitaxial layer filled into said at least one recess.

2. The strained silicon channel semiconductor structure of claim 1, wherein a spacer is formed around said gate structure, said upper sidewall is formed under said spacer.

3. The strained silicon channel semiconductor structure of claim 1, wherein a cross-section shape of said at least one recess is a diamond-like shape.

4. The strained silicon channel semiconductor structure of claim 1, wherein a vertical distance from the intersection of said upper sidewall and said lower sidewall to the surface of said substrate is smaller than 200 Å.

5. The strained silicon channel semiconductor structure of claim 1, wherein a horizontal distance from the intersection of said upper sidewall and the surface of said substrate to said gate structure is smaller than 130 Å.

6. The strained silicon channel semiconductor structure of claim 1, wherein the material of said epitaxial layer is SiGe or SiC.

7. The strained silicon channel semiconductor structure of claim 1, wherein said epitaxial layer is used as a stress source for a strained silicon channel.

* * * * *